United States Patent
Imade

(10) Patent No.: US 11,316,192 B2
(45) Date of Patent: Apr. 26, 2022

(54) CONTROL APPARATUS AND BATTERY SYSTEM

(71) Applicant: Toyota Jidosha Kabushiki Kaisha, Toyota (JP)

(72) Inventor: Yuki Imade, Okazaki (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 16/219,140

(22) Filed: Dec. 13, 2018

(65) Prior Publication Data

US 2019/0190066 A1   Jun. 20, 2019

(30) Foreign Application Priority Data

Dec. 14, 2017 (JP) .............................. JP2017-239430

(51) Int. Cl.
| | |
|---|---|
| H01M 10/0562 | (2010.01) |
| H01M 10/613 | (2014.01) |
| G01R 31/382 | (2019.01) |
| H01M 10/04 | (2006.01) |
| H01M 10/48 | (2006.01) |
| H01M 10/058 | (2010.01) |
| H01M 10/615 | (2014.01) |
| H01M 10/66 | (2014.01) |
| H01M 10/63 | (2014.01) |
| H01M 10/052 | (2010.01) |

(Continued)

(52) U.S. Cl.
CPC ...... *H01M 10/0562* (2013.01); *G01R 31/382* (2019.01); *H01M 10/0431* (2013.01); *H01M 10/0481* (2013.01); *H01M 10/052* (2013.01); *H01M 10/058* (2013.01); *H01M 10/48* (2013.01); *H01M 10/613* (2015.04); *H01M 10/615* (2015.04); *H01M 10/63* (2015.04); *H01M 10/66* (2015.04); *H01M 50/116* (2021.01); *G01R 31/389* (2019.01); *H01M 2220/20* (2013.01)

(58) Field of Classification Search
CPC ......... H01M 10/0562; H01M 10/0431; H01M 10/48; H01M 10/613; G01R 31/382
See application file for complete search history.

(56) References Cited

U.S. PATENT DOCUMENTS

| | | | |
|---|---|---|---|
| 2009/0017371 A1 | 1/2009 | Nakamura | |
| 2017/0200994 A1* | 7/2017 | Kim | ...... G01R 31/392 |
| 2019/0148796 A1* | 5/2019 | Yoshida | ...... H01M 10/46 320/134 |

FOREIGN PATENT DOCUMENTS

| | | |
|---|---|---|
| CN | 101461086 A | 6/2009 |
| JP | 2016018704 A | 2/2016 |

(Continued)

*Primary Examiner* — Stewart A Fraser
(74) *Attorney, Agent, or Firm* — Dinsmore & Shohl LLP

(57) ABSTRACT

A control apparatus is configured to control an all solid state battery, the all solid state battery includes a laminated body in which a cathode, an anode and a solid electrolyte layer are laminated, the control apparatus is configured to execute a control operation for controlling a temperature distribution of the all solid state battery in a plane that intersects with a laminated direction of the laminated body so that a difference between a resistance value of a first part of the all solid state battery and a resistance value of a second part of the all solid state battery is smaller than the difference in the case where the control operation is not executed.

19 Claims, 13 Drawing Sheets

(51) Int. Cl.
*H01M 50/116* (2021.01)
*G01R 31/389* (2019.01)

(56) References Cited

FOREIGN PATENT DOCUMENTS

| KR | 2016-0028848 A | 3/2016 |
| KR | 2016-0053540 A | 5/2016 |

* cited by examiner

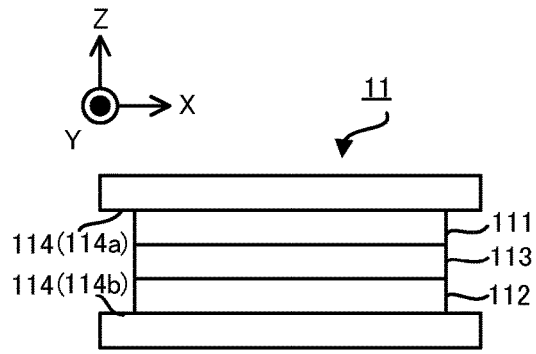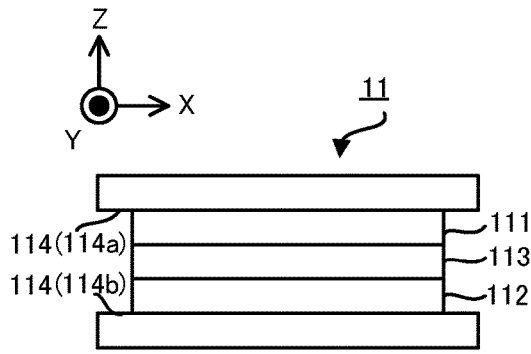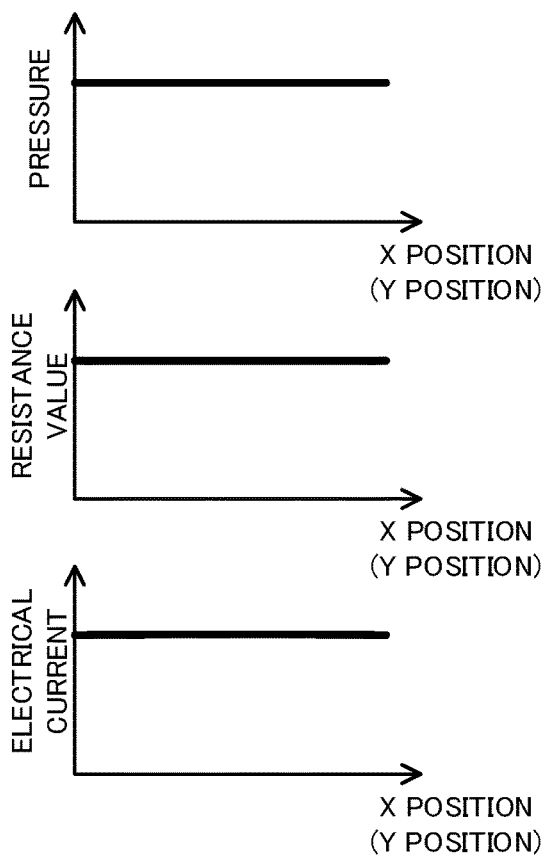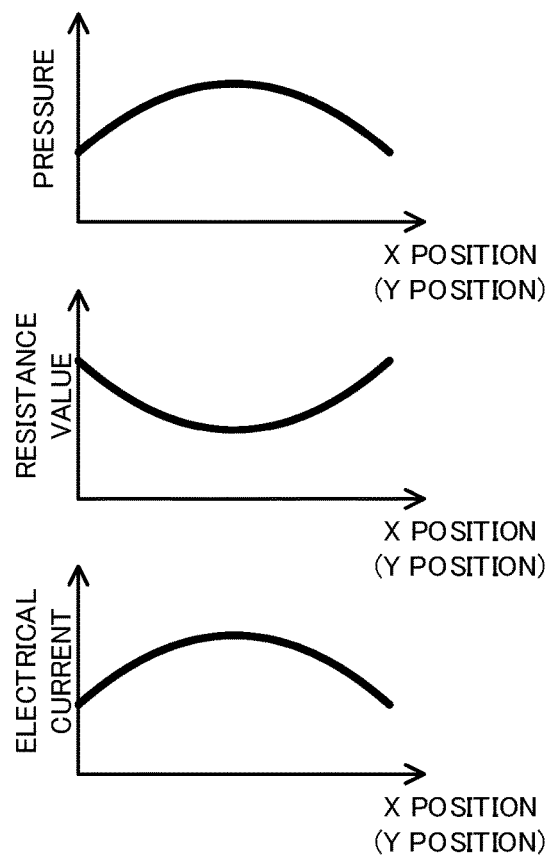
FIG. 3A  FIG. 3B

CONTROL APPARATUS AND BATTERY SYSTEM

CROSS-REFERENCE TO RELATED APPLICATIONS

This application claims priority to Japanese Patent Application No. 2017-239430, filed on Dec. 14, 2017, the entire contents of which are incorporated herein by reference.

TECHNICAL FIELD

The present disclosure relates to a technical field of a control apparatus that is configured to control an all solid state battery and a battery system having the control apparatus like this.

BACKGROUND ART

An all solid state battery having a solid electrolyte layer is known. For example, a Patent Literature 1 discloses an all solid state battery including a laminated body in which a cathode, an anode and a solid electrolyte layer are laminated, wherein a restraining member applies a pressure to the all solid state battery in a laminated direction of the laminated body.

CITATION LIST

Patent Literature

[Patent Literature 1] Japanese Unexamined Patent Application Publication No. 2016-018704

SUMMARY

Technical Problem

There is a possibility that the pressure applied to the all solid state battery from the restraint member varies in a plane that intersects with the laminated direction of the laminated body. For example, when the anode and the like expands or contracts due to a charge or a discharge of the all solid state battery, there is a possibility that the pressure applied to a first part of the all solid state battery is larger than the pressure applied to a second part of the all solid state battery. For example, there is a possibility that the pressure applied to the first part of the all solid state battery is larger than the pressure applied to the second part of the all solid state battery due to a creep (namely, a distortion) of the restraining member If the pressure applied to the first part is larger than the pressure applied to the second part, a resistance value of the first part is smaller than the resistance value of the second part, because of characteristics of the all solid state battery. In this case, when the all solid state battery is charged or discharged, an electric current flowing in the first part is larger than the electric current flowing in the second part. That results in a technical problem that a local (partial) overcharge and/or over discharge of the all solid state battery occurs and thus the all solid state battery may deteriorate.

The above described technical problem is one example of the technical problem to be solved by the present disclosure, it is therefore an object of the present disclosure to provide, for example, a control apparatus that is configured to control an all solid state battery including a laminated body in which a cathode, an anode and a solid electrolyte layer are laminated and to prevent an unevenness (in other words, a variation or a variability) of a resistance value of the all solid state battery in a plane that intersecting with a laminated direction of the laminated body. It is also an object of the present disclosure to provide, for example, a battery system having the control apparatus like this.

Solution to Problem

One aspect of a control apparatus of the present disclosure is configured to control an all solid state battery, the all solid state battery includes a laminated body in which a cathode, an anode and a solid electrolyte layer located between the cathode and the anode are laminated, the control apparatus is configured to execute a control operation for controlling a temperature distribution of the all solid state battery in a plane that intersects with a laminated direction of the laminated body so that a difference between a resistance value of a first part of the all solid state battery and a resistance value of a second part of the all solid state battery that is different from the first part in the plane is smaller than the difference in the case where the control operation is not executed.

One aspect of a battery system of the present disclosure is provided with: an all solid state battery including a laminated body in which a cathode, an anode and a solid electrolyte layer located between the cathode and the anode are laminated; and the above described one aspect of the control apparatus of the present disclosure.

BRIEF DESCRIPTION OF DRAWINGS

FIG. 3A is a graph that illustrates a distribution in a XY plane of each of a pressure applied to the all solid state battery, a resistance value of the all solid state battery and an amount of an electric current flowing in the all solid state battery when a restraining member applies an even pressure to the all solid state battery, and FIG. 3B is a graph that illustrates a distribution in the XY plane of each of the pressure applied to the all solid state battery, the resistance value of the all solid state battery and the amount of the electric current flowing in the all solid state battery when the restraining member applies an uneven pressure to the all solid state battery.

DESCRIPTION OF EMBODIMENTS

Hereinafter, with reference to drawings, an embodiment of each of the control apparatus and the battery system of the present disclosure will be described. In the following description, a vehicle 1 to which one embodiment of each of the control apparatus and the battery system of the present disclosure is adapted will be described.

(1) STRUCTURE OF VEHICLE 1

Firstly, with reference to FIG. 1 and FIG. 2, the structure of the vehicle 1 in the present embodiment will be explained.

Figure 1:
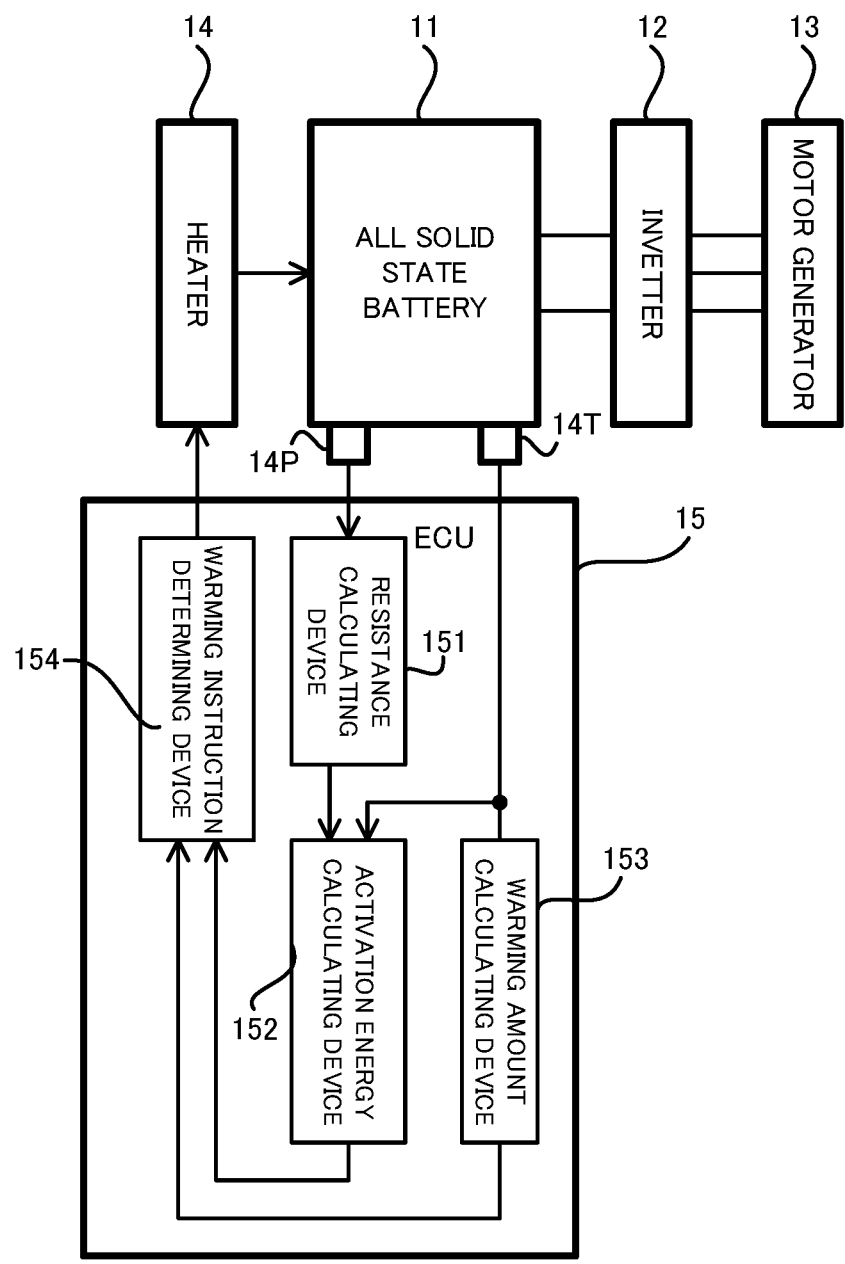
FIG. 1 is a block diagram that illustrates a structure of a vehicle in a present embodiment.
Figure 2:
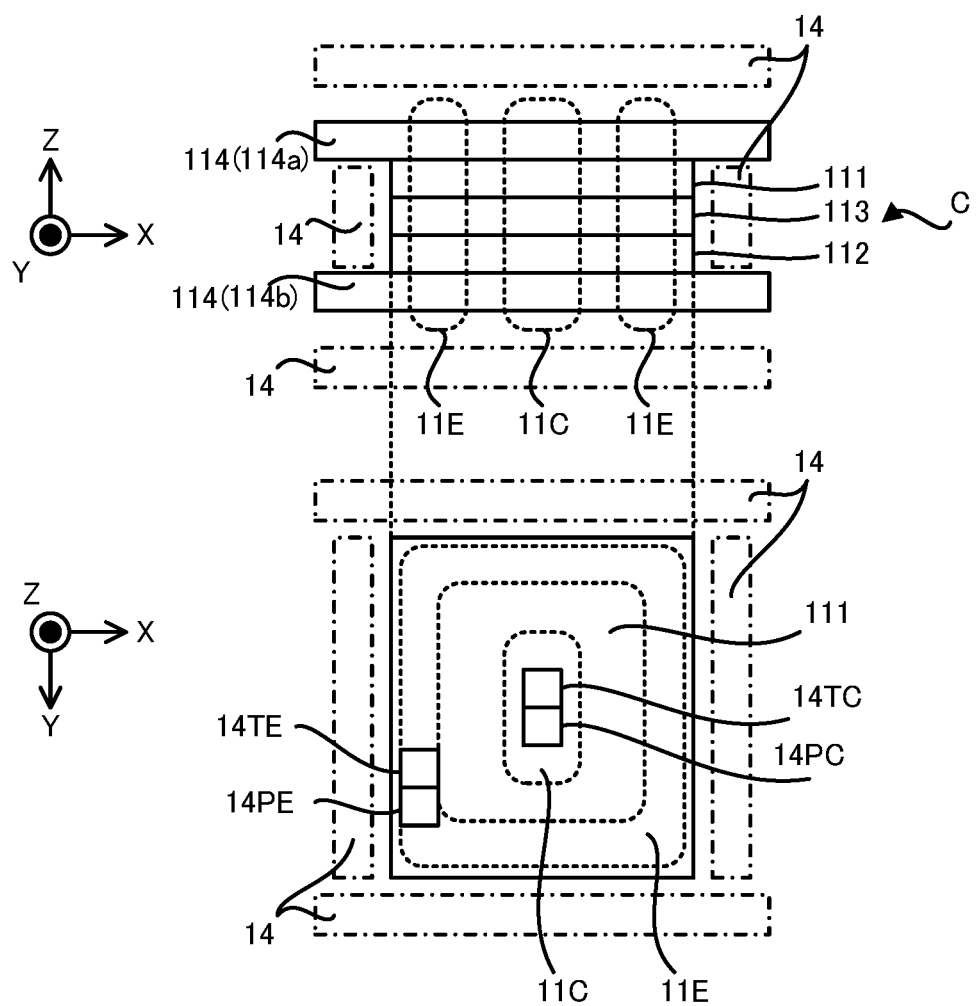
FIG. 2 includes a cross-sectional view and a top view that illustrate a cross-sectional surface and a top surface of an all solid state battery of the vehicle, respectively.

FIG. 1 is a block diagram that illustrates the structure of the vehicle 1 in the present embodiment. FIG. 2 includes a cross-sectional view and a top view that illustrate a cross-sectional surface and a top surface of an all solid state battery 11 of the vehicle 1, respectively.

As illustrated in FIG. 1, the vehicle 1 is provided with: the all solid state battery 11; an inverter 12; a motor generator 13, a heater 14 that is one example of a "warm apparatus" in a below described additional statement; a temperature sensor 14T; a pressure sensor 14P; and an ECU (Electronic Control Unit) 15 that is one example of a "control apparatus" in the below described additional statement.

The all solid state battery 11 is a secondary battery in which an electrolyte is a solid. The all solid state battery 11 is provided with a cell C in which a cathode 111, an anode 112 and a solid electrolyte layer 113 located between the cathode 111 and the anode 112 are laminated (namely, layered) in a Z axis direction, as illustrated in an upper cross-sectional view in FIG. 2. The all solid state battery 11 may be provided with a single cell C. The all solid state battery 11 may be provided with a plurality of cells C as a stack. Each of the cathode 111, the anode 112 and the solid electrolyte layer 113 is a solid. Note that a detailed description about a material (in other words, a substance) of each of the cathode 111, the anode 112 and the solid electrolyte layer 113 is omitted, because an existing material (for example, a material disclosed in the Patent Literature 1) may be used as the material of each of the cathode 111, the anode 112 and the solid electrolyte layer 113.

A restraining member 114 applies a pressure to the all solid state battery 11 in a laminated direction (namely, a direction along which the cathode 111, the anode 112 and the solid electrolyte layer 113 are laminated and the Z axis direction) of the cell C. Namely, the restraining member 114 is configured to restrain the all solid state battery 11. Specifically, as illustrated in the upper cross-sectional view in FIG. 2, the restraining member 114 includes a restraining plate 114a and a restraining plate 114b. The restraining plate 114a supports the cell C at the cathode 111 side. The restraining plate 114a applies the pressure to the cathode 111 so that the cathode 111 is pressed into the solid electrolyte layer 113. The restraining plate 114b supports the cell C at the anode 112 side. The restraining plate 114b applies the pressure to the anode 112 so that the anode 112 is pressed into the solid electrolyte layer 113. In some embodiments, the restraining member 114 applies the pressure to the stack including the plurality of cells C if the all solid state battery 11 is provided with the plurality of cells C.

Again in FIG. 1, the inverter 12 is configured to convert a direct electrical power outputted from the all solid state battery 11 into an alternating electrical power and to output the alternating electrical power to the motor generator 13, when the vehicle 1 is in a power running mode. The inverter 12 is configured to convert the alternating electrical power generated by a regeneration of the motor generator 13 into the direct electrical power and to output the direct electrical power to the all solid state battery 11, when the vehicle 1 is in a regeneration mode.

The motor generator 13 is configured to function as a motor for outputting a driving force that is necessary for the vehicle 1 to travel (in other words, move) by operating with the electrical power supplied from the all solid state battery 11 via the inverter 12, when the vehicle 1 is in the power running mode. The motor generator 13 is configured to function as a generator for charging the all solid state battery 11, when the vehicle 1 is in the regeneration mode.

The heater 14 is a warm apparatus that is configured to warm a part or a whole of the all solid state battery 11 under the control of the ECU 15. The heater 14 is located to be close to or to contact with an outer surface of at least one of the all solid state battery 11 and the restraining member 114, as illustrated in FIG. 2.

The temperature sensor 14T is a detection apparatus that is configured to detect a temperature T of a certain part of the all solid state battery 11. The vehicle 1 is provided with at least two temperature sensors 14T that are located at different positions in a plane (namely, a XY plane) that intersects with the laminated direction of the cell C. The present embodiment will be described by using an example in which the vehicle 1 is provided with a temperature sensor 14TC that is configured to detect a temperature TC of a center part 11C of the all solid state battery 11 and a temperature sensor 14TE that is configured to detect a temperature TE of an edge part 11E of the all solid state battery 11, as illustrated in a lower planar view in FIG. 2. The center part 11C is a part that is located inside of the edge part 11E in the XY plane, as illustrated in the lower planar view in FIG. 2. On the other hand, the edge part 11E is a part that is located outside of the center part 11C in the XY plane. In some embodiments, the edge part 11E is a part that includes or is located near an outer rim (in other words, an outer circumference) of the all solid state battery 11 in the XY plane. At least one of the temperature sensors 14TC and 14TE may be located between the restraining plate 114a and the cathode 111, may be located between the restraining plate 114b and the anode 112 or may be located at another position.

The pressure sensor 14P is a detection apparatus that is configured to detect a pressure p applied to a certain part of the all solid state battery 11 from the restraining member 114. The vehicle 1 is provided with at least two pressure sensors 14P that are located at different positions in the XY plane. The present embodiment will be described by using an example in which the vehicle 1 is provided with a pressure sensor 14PC that is configured to detect a pressure PC applied to the center part 11C of the all solid state battery 11 from the restraining member 114 and a pressure sensor 14PE that is configured to detect a pressure PE applied to the edge part 11E of the all solid state battery 11 from the restraining member 114, as illustrated in the lower planar view in FIG. 2. At least one of the pressure sensors 14PC and 14PE may be located between the restraining plate 114a and the cathode 111, may be located between the restraining plate 114b and the anode 112 or may be located at another position. In some embodiments, the pressure sensor 14PC is located near the temperature sensor 14TC. In some embodiments, the pressure sensor 14PE is located near the temperature sensor 14TE.

The ECU 15 is configured to control entire operation of the vehicle 1. Especially in the present embodiment, the ECU 15 is configured to execute a temperature control operation for controlling, by using the heater 14, a temperature distribution of the all solid state battery 11 in a plane that intersects with the laminated direction of the cell C (the XY plane in an example illustrated in FIG. 2, and the plane that intersects with the laminated direction of the cell C is referred to as the "XY plane") on the basis of a detection result of each of the temperature sensors 14T and the pressure sensors 14P. In the below described description, the ECU 15 is configured to execute the temperature control operation for warming the edge part 11E so that a difference between a resistance value RC of the center part 11C of the all solid state battery 11 and a resistance value RE of the edge part 11E of the all solid state battery 11 is smaller than the difference in the case where the temperature control operation is not executed. In order to execute the temperature control operation, the ECU 15 is provided with, as processing blocks that are logically realized in the ECU 15, a resistance calculating device 151, an activation energy calculating device 152, a warming amount calculating device 153 and a warming instruction determining device 154. Note that the operation of each of the resistance calculating device 151, the activation energy calculating device 152, the warming amount calculating device 153 and the warming instruction determining device 154 will be described later in detail when the temperature control operation is described, and thus the description of the operation is omitted here.

(2) TEMPERATURE CONTROL OPERATION OF ECU 13

Next, the temperature control operation that is executed by the ECU 15 will be described in order.

(2-1) Technical Reason Why Temperature Control Operation is Executed

Firstly, with reference to FIG. 3A and FIG. 3B, a technical reason why the temperature control operation is executed will be described. As described above, the restraining member 114 restrains the all solid state battery 11 so that the restraining member 114 applies the pressure to the all solid state battery 11 in the laminated direction of the cell C. In this case, the restraining member 114 restrains the all solid state battery 11 usually (alternatively, in an initial state) so that the pressure that is even in the XY plane is applied to the all solid state battery 11 (namely, the pressure applied to the all solid state battery 11 does not vary in the XY plane), as illustrated in a first graph in FIG. 3A. In this case, as illustrated in a second graph in FIG. 3A, the resistance values of a plurality of parts of the all solid state battery 11 are uniformed in the XY plane. Namely, the resistance value of the all solid state battery 11 does not vary in the XY plane. As a result, as illustrated in a third graph in FIG. 3A, electrical currents that flows in the plurality of parts of the all solid state battery 11, respectively, are uniformed in the XY plane.

However, the anode 112 (furthermore, at least one of the cathode 111 and the solid electrolyte layer 113 in some cases) expands or contracts due to a charge and a discharge of the all solid state battery 11 in practice. If the anode 112 expands or contracts, the pressure applied to the anode 112 from the restraining member 114 (furthermore, the pressure applied to the cathode 111 that is substantially coupled with the anode 112) varies. Specifically, as illustrated in a first graph in FIG. 3B, there is a high possibility that the pressure applied to the center part 11C from the restraining member 114 is larger than the pressure applied to the edge part 11E from the restraining member 114 when the anode 112 expands or contracts. The reason is as follows. The edge part 11E has a surface (specifically, a surface along the Z axis direction in FIG. 2) that does not contact with the restraining member 114, and thus a first electrode part that is one part of the anode 112 and that is near the edge part 11E actually expands or contracts due to an expansion or a contraction of the anode 112 relatively easily so that the first electrode part releases a force caused by the expansion or the contraction of the anode 112. On the other hand, the center part 11C is restrained by the restraining member 114 more strongly (firmly) than the edge part 11E, and thus a second electrode part that is one part of the anode 112 and that is near the center part 11C does not actually expands or contracts due to the expansion or the contraction of the anode 112 so easily so that the second electrode part releases the force caused by the expansion or the contraction of the anode 112. As a result, the pressure PE applied to the edge part 11E from the restraining member 114 can be released more easily than the pressure PC applied to the center part 11C from the restraining member 114. Namely, the pressure PC applied to the center part 11C from the restraining member 114 is accumulated as a stress force between the restraining member 114 and the center part 11C more easily than the pressure PE applied to the edge part 11E from the restraining member 114. In this case, as illustrated in a second graph in FIG. 3B, the resistance value RC of the center part 11C is smaller than the resistance value RE of the edge part 11E in the XY plane. As a result, as illustrated in a third graph in FIG. 3B, the electrical current flowing in the center part 11C is larger than the electrical current flowing in the edge part 11E in the XY plane. Namely, the all solid state battery 11 includes a part in which the large electrical current flows locally. In this case, the center part 11C is overcharged and/or over-discharged more easily than the edge part 11E. That results in a technical problem that the all solid state battery 11 deteriorates relatively easily.

This technical problem results from the pressure PC applied to the center part 11C being different from the pressure PE applied to the edge part 11E. Thus, a method of preventing the pressure PC applied to the center part 11C from being different from the pressure PE applied to the edge part 11E is anticipated as one solution for solving the technical problem. However, the relatively heavy-duty (in other words, sturdy) structured restraining member 114 that is allowed to apply the even pressure to the cell C is necessarily required in order to prevent the pressure PC applied to the center part 11C from being different from the pressure PE applied to the edge part 11E. Thus, a cost, a weight and a size of the restraining member 114 increase.

Therefore, in the present embodiment, the temperature distribution of the all solid state battery 11 is controlled so as to reduce the difference between the resistance value RC of the center part 11C and the resistance value RE of the edge part 11E that is caused by the pressure PC applied to the center part 11C being different from the pressure PE applied to the edge part 11E, while allowing the pressure PC applied to the center part 11C to be different from the pressure PE applied to the edge part 11E. Specifically, if the temperature TE of the edge part 11E of the all solid state battery 11 increases, the resistance value RE of the edge part 11E after the temperature TE of the edge part 11E increases is smaller than the resistance value RE before the temperature TE of the edge part 11E increases. On the other hand, if the temperature TE of the edge part 11E decreases, the resistance value RE of the edge part 11E after the temperature TE of the edge part 11E decreases is larger than the resistance value RE before the temperature TE of the edge part 11E decreases. Thus, the ECU 15 is capable of reducing the difference between the resistance value RC of the center part 11C and the resistance value RE of the edge part 11E by executing the temperature control operation. Specifically, the ECU 15 is capable of reducing the difference between the resistance value RC of the center part 11C and the resistance value RE of the edge part 11E by executing the temperature control operation for controlling the temperature distribution of the all solid state battery 11 so that the temperature TC of the center part 11C is different from the temperature TE of the edge part 11E. Namely, in a situation where the resistance value RC of the center part 11C is greatly different from the resistance value RE of the edge part 11E due to the pressure PC being different from the pressure PE if the temperature TC of the center part 11C is kept to be same as the temperature TE of the edge part 11E, the ECU 15 executes the temperature control operation for making the temperature TC of the center part 11C be different from the temperature TE of the edge part 11E so that the difference between the resistance value RC of the center part 11C and the resistance value RE of the edge part 11E is reduced. In this case, the relatively heavy-duty structured restraining member 114 is not necessarily required, and thus the above described technical problem can be solved by a relatively simple structure.

(2-2) Specific Flow of Temperature Control Operation

Figure 4:
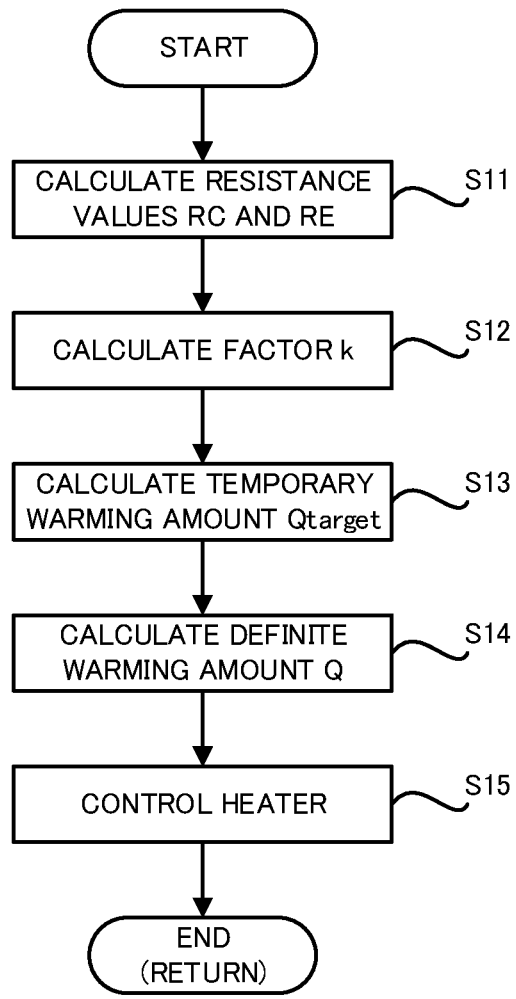
FIG. 4 is a flowchart that illustrates a flow of a temperature control operation.

Next, with reference to FIG. 4, a specific flow of the temperature control operation will be described. FIG. 4 is a flowchart that illustrates the flow of the temperature control operation.

Figure 5:
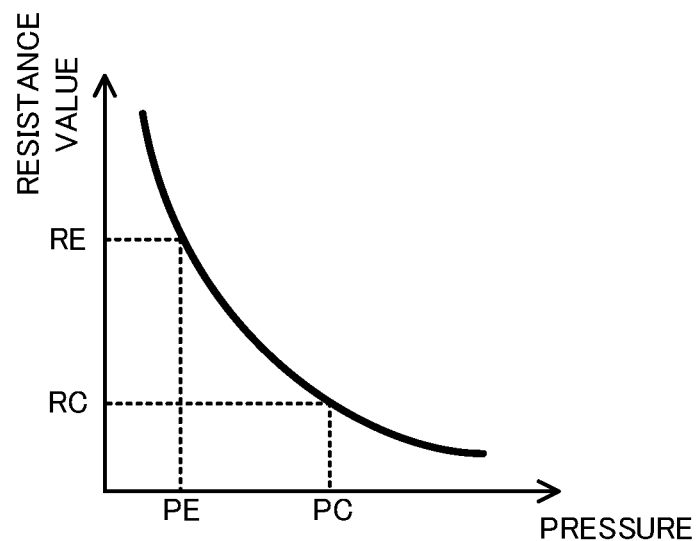
FIG. 5 is a graph that illustrates a relationship between the pressure applied to a certain part of the all solid state battery from the restraining member and the resistance value of this certain part.

As illustrated in FIG. 4, the resistance calculating device 151 calculates the resistance value RC of the center part 11C and the resistance value RE of the edge part 11E on the basis of the detection result of the pressure sensors 14PC and 14PE (namely, the pressure RC applied to the center part 11C and the pressure PE applied to the edge part 11E) (a step S11). Specifically, between the pressure P applied to a certain part of the all solid state battery 11 from the restraining member 114 and the resistance value R of this certain part, there is a correlation that the resistance value R decreases more as the pressure P increases more as illustrated in FIG. 5. Thus, the resistance calculating device 151 calculates the resistance values RC and RE from the pressures PC and PE, respectively, on the basis of an information (for example, a map) that represents the correlation between the pressure P and the resistance value R as illustrated in FIG. 5.

Figure 6:
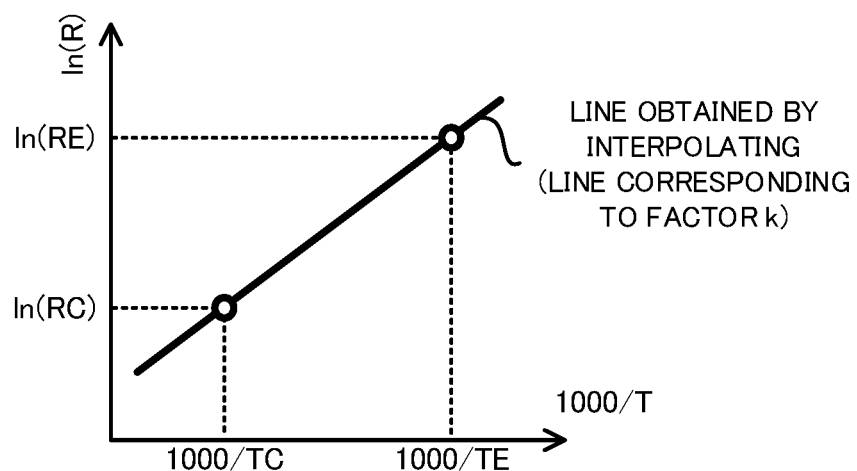
FIG. 6 is a graph that illustrates a process of calculating an activation energy factor executed by an activation energy calculating device.

Then, the activation energy calculating device 152 calculates a factor k that is proportional to an inverse number of an activation energy of the all solid state battery 11 on the basis of the resistance values RC and RE calculated at the step S11 and the detection result of the temperature sensors 14TC and 14TE (namely, the temperature TC of the center part 11C and the temperature TE of the edge part 11E) (a step S12). Hereinafter, this factor is referred to as an "activation energy factor". Specifically, as illustrated in FIG. 6, the activation energy calculating device 152 plots a point corresponding to the resistance value RC and the temperature TC of the center part 11C and a point corresponding to the resistance value RE and the temperature TE of the edge part 11E on a planar coordinate system in which a horizontal axis represents an inverse number of the temperature T and a vertical axis represents a natural logarithm value of the resistance value R. This plotted graph constitutes what we call an Arrhenius plot. Then, the activation energy calculating device 152 calculates, as the activation energy factor k, an inverse number of a slope of a line that is obtained by interpolating the plotted points. Any method may be used as a method of interpolating the plotted points. For example, a Lagrange interpolating polynomial is one example of that method. If the activation energy factor k is calculate by using the Lagrange interpolating polynomial, the activation energy calculating device 152 may calculate the activation energy factor k by using a mathematical expression of "$k=(1/TE-1/TC)/(\ln(RE)-\ln(RC))$".

The activation energy factor k becomes smaller as the difference between the resistance value RE and the resistance value RC becomes larger. On the other hand, the activation energy factor k becomes larger as the difference between the resistance value RE and the resistance value RC becomes smaller. Therefore, the process of calculating the activation energy factor k is substantially equivalent to a process of determining how large the difference between the resistance value RE and the resistance value RC is.

In parallel with the process of calculating the activation energy factor k at the step S12, the warming amount calculating device 153 calculates a temporary warming amount Qtarget on the basis of the pressure PC, the pressure PE, the temperature TC and the temperature TB (a step S13). The temporary warming amount Qtarget represents a temporary target value of an amount of heat that should be applied (in other words, transferred) to the all solid state battery 11 (especially, the edge part 11E thereof) by the warming of the heater 14.

Figure 7A:
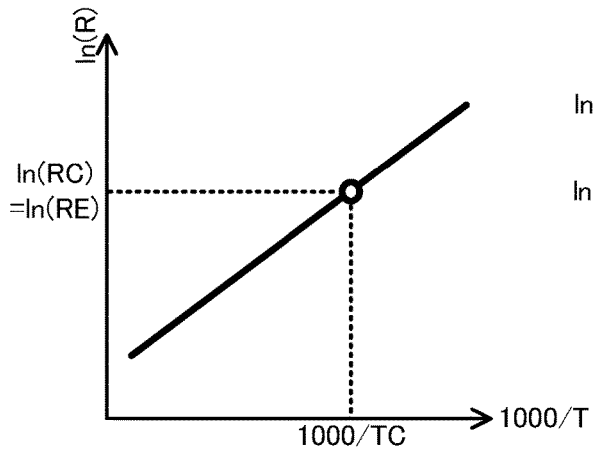
FIG. 7A is a graph that illustrate a situation in which the resistance value of a center part of the all solid state battery is equal to the resistance value of an edge part of the all solid state battery on a planar coordinate system in which a horizontal axis represents an inverse number of the temperature and a vertical axis represents a natural logarithm value of the resistance value.
Figure 7B:
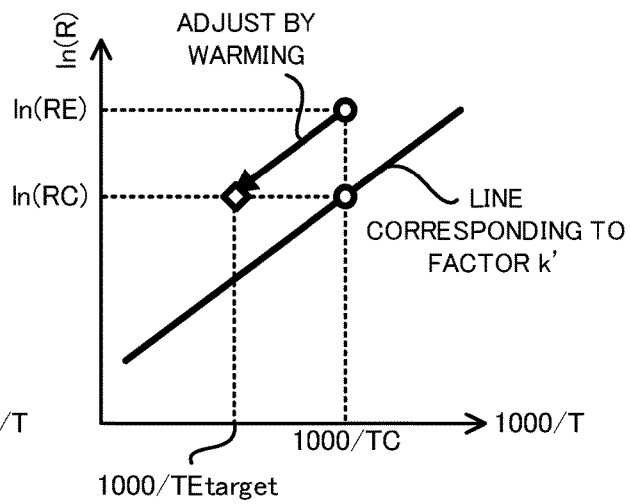
FIG. 7B is a graph that illustrate a situation in which the resistance value of the center part of the all solid state battery is different from the resistance value of the edge part of the all solid state battery on the planar coordinate system in which the horizontal axis represents the inverse number of the temperature and the vertical axis represents the natural logarithm value of the resistance value.

Specifically, as illustrated in FIG. 7A, when the resistance value RC is same as the resistance value RE, the point corresponding to the resistance value RC and the temperature TC is same as the point corresponding to the resistance value RE and the temperature TE on the planar coordinate system in which the horizontal axis represents the inverse number of the temperature T and the vertical axis represents the natural logarithm value of the resistance value R. In this case, the all solid state battery 11 may not be necessarily warmed. On the other hand, as illustrated in FIG. 7B, when the resistance value RC is different from the resistance value RE, the point corresponding to the resistance value RC and the temperature TC is away from the point corresponding to the resistance value RE and the temperature TE along at least the vertical axis on the planar coordinate system in which the horizontal axis represents the inverse number of the temperature T and the vertical axis represents the natural logarithm value of the resistance value R. Note that FIG. 7B illustrates an example in which the temperature TC is same as the temperature TE for the purpose of the simple description. In this case, if the edge part 11E is warmed until the temperature TE of the edge part 11E reaches a target temperature TE_target, the resistance value RE is reduced to be same as the resistance value RC.

Thus, the warming amount calculating device 153 firstly calculates the target temperature TE_target. Here, one specific example of process of calculating the target temperature TE_target will be described, however, the warming amount calculating device 153 may calculate the target temperature TE_target (alternatively, the temporary warming amount Qtarget) by using another method. When the warming amount calculating device 153 executes one specific example of process of calculating the target temperature TE_target, the warming amount calculating device 153 obtains an activation energy factor k' that is unique to the all solid state battery 11. The activation energy factor k' is proportional to the inverse number of the activation energy of the all solid state battery 11, as with the above described activation energy factor k. In order to calculate the activation energy factor k', firstly, the resistance value R of the all solid state battery 11 in an ideal state is measured while varying the temperature T of the all solid state battery 11 in the ideal state. The all solid state battery 11 in the ideal state is the all solid state battery 11 in which the pressure PC is same as the pressure PE (namely, the even pressure is applied in the XY plane). Then, the relationship between the measured resistance value R and the temperature T is plotted on the planar coordinate system in which the horizontal axis represents the inverse number of the temperature T and the vertical axis represents the natural logarithm value of the resistance value R. Then, an inverse number of a slope of a line that is obtained by interpolating the plotted points is calculated as the activation energy factor k'. The calculated activation energy factor k' is stored in a memory and the like. The warming amount calculating device 153 reads the activation energy factor k' stored in the memory and the like in calculating the target temperature TE_target. Then, the warming amount calculating device 153 calculates the target temperature TE_target by using a mathematical expression of "TE_target=1000/(1000/TC−k'×(ln(RE)−ln(RC)))".

Then, the warming amount calculating device 153 calculates the temporary warming amount Qtarget on the basis of the calculated target temperature TE_target, the actual temperature TE of the edge part 11E and a heat capacity C of the all solid state battery 11. Specifically, the warming amount calculating device 153 calculates the temporary warming amount Qtarget by using a mathematical expression of "Qtarget=C×(TE_target−TE".

Then, the warming instruction determining device 154 calculates a definite warming amount Q on the basis of the activation energy factor k calculated at the step S12, the temporary warming amount Qtarget calculated at the step S13 and a SOC (State Of Charge) of the all solid state battery 11 (a step S14). The definite warming amount Q represents a final target value of the amount of the heat that should be applied to the all solid state battery 11 (especially, the edge part 11E thereof) by the warming of the heater 14.

Figure 8:
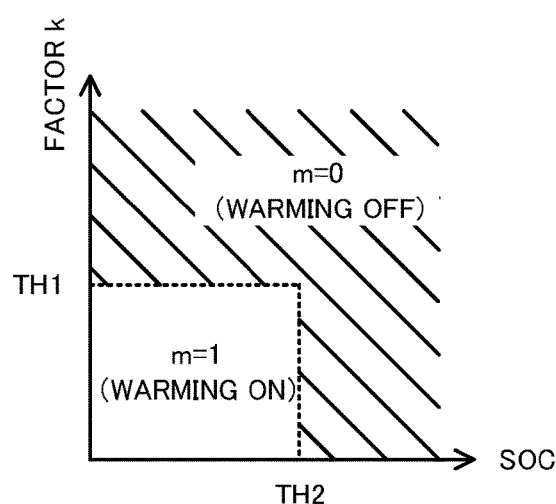
FIG. 8 is a graph that illustrates a relationship among a warm flag that indicates whether to warm the all solid state battery, the activation energy factor of the all solid state battery and a SOC (State of Charge) of the all solid state battery.

Specifically, the warming instruction determining device 154 sets a warming flag m that indicates whether to warm the all solid state battery 11 by the heater 14, in order to calculates the definite warming amount Q. The warming instruction determining device 154 sets, to the warming flag m, a value of "1" that indicates that the all solid state battery 11 should be warmed by the heater 14, if the activation energy factor k is smaller than a predetermined threshold value TH1 and the SOC is smaller than a predetermined threshold value TH2, as illustrated in FIG. 8. On the other hand, the warming instruction determining device 154 sets, to the warming flag m, a value of "0" that indicates that the all solid state battery 11 should not be warmed by the heater 14, if the activation energy factor k is larger than the threshold value TH1 and/or the SOC is larger than the threshold value TH2. When the activation energy factor k is same as the threshold value TH1, the warming instruction determining device 154 may execute the process that is executed when the activation energy factor k is larger than the threshold value TH1 or may execute the process that is executed when the activation energy factor k is smaller than the threshold value TH1. When the SOC is same as the threshold value TH2, the warming instruction determining device 154 may execute the process that is executed when the SOC is larger than the threshold value TH2 or may execute the process that is executed when the SOC is smaller than the threshold value TH2.

The reason why the all solid state battery 11 is not warmed when the activation energy factor k is larger than the threshold value TH1 is as follows. Firstly, as described above, the activation energy factor k becomes larger as the difference between the resistance value RC and the resistance value RE becomes smaller. Namely, if the activation energy factor k is larger than the threshold value TH1, the difference between the resistance value RC and the resistance value RF should be relatively small. If the difference between the resistance value RC and the resistance value RE is relative small, the above described technical problem such as the deterioration of the all solid state battery 11 does not occur remarkably, compared to the case where the difference between the resistance value RC and the resistance value RE is relatively large. On the other hand, if the temperature of the all solid state battery 11 increases too much due to the warming of the all solid state battery 11, there is a possibility that the all solid state battery 11 deteriorates. Thus, in the present embodiment, the warming instruction determining device 154 determines that the all solid state battery 11 should not be warmed by the heater 14, when the technical problem such as the deterioration of the all solid state battery 11 does not occur remarkably (namely, when the activation energy factor k is larger than the threshold value TH1). Namely, in the present embodiment, the all solid state battery 11 is warmed by the heater 14, when the technical problem such as the deterioration of the all solid state battery 11 occurs remarkably (namely, when the activation energy factor k is smaller than the threshold value TH1).

Considering the above described reason why the all solid state battery 11 is not warmed when the activation energy factor k is larger than the threshold value TH1, in some embodiments, the threshold value TH1 is set to an appropriate value that allows a situation where the technical problem such as the deterioration of the all solid state battery 11 occurs remarkably and a situation where the technical problem such as the deterioration of the all solid state battery 11 does not occur remarkably to be distinguished from each other on the basis of the activation energy factor k (namely, on the basis of the difference between the resistance value RE and the resistance value RC).

Moreover, the reason why the all solid state battery 11 is not warmed when the SOC is larger than the threshold value TH2 is as follows. Firstly, the anode 112 (furthermore, at least one of the cathode 111 and the solid electrolyte layer 113 in some cases) expands more as the SOC becomes larger, because of characteristics of the all solid state battery 11. As a result, as illustrated in a lower graph in FIG. 9, the pressure applied to the all solid state battery 11 from the restraining member 114 becomes larger as the SOC becomes larger.

Figure 9:
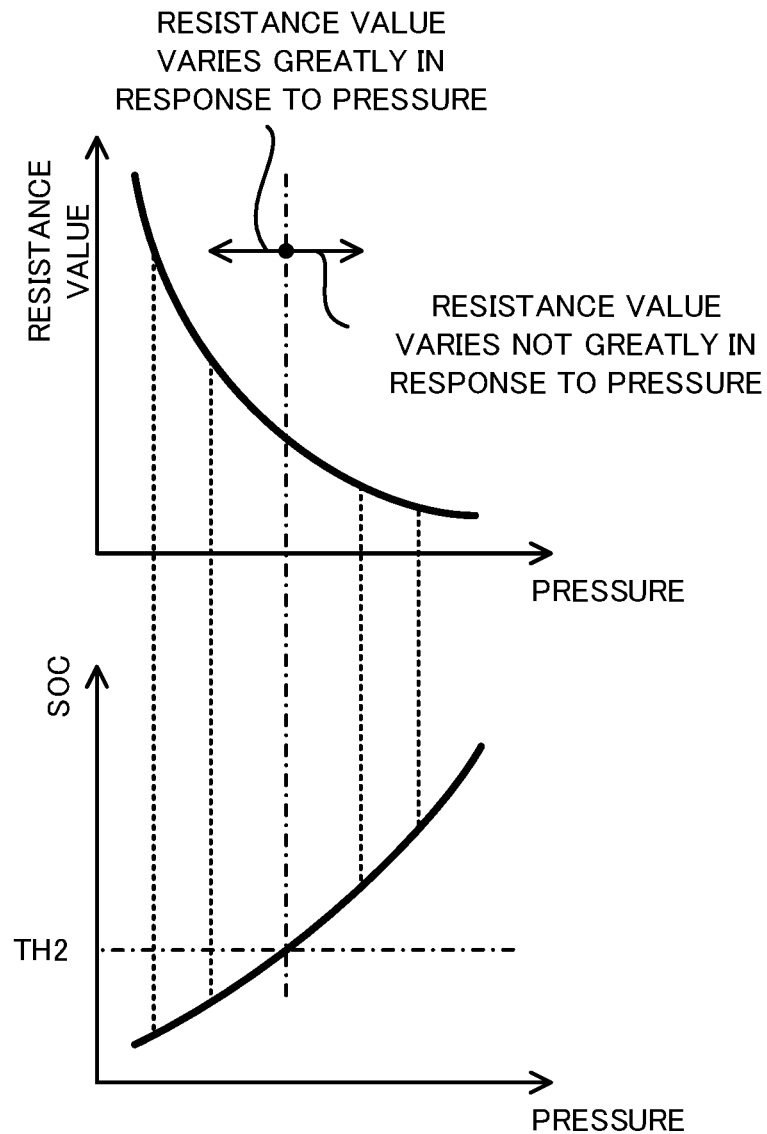
FIG. 9 is a graph that illustrates a relationship among the pressure applied to the all solid state battery, the resistance value of the all solid state battery and the SOC of the all solid state battery.

On the other hand, as illustrated in an upper graph in FIG. 9, the resistance value R of a certain part of the all solid state battery 11 varies more greatly in response to the variation of the pressure P applied to this certain part, as the pressure P applied to the all solid state battery 11 from the restraining member 114 becomes smaller. Thus, an amount of the variation of the resistance value R of the certain part of the all solid state battery 11 that varies in response to the variation of the pressure P applied to this certain part (in other words, a rate of the amount of the variation of the resistance value R with respect to an unit amount of the variation of the pressure P applied to this certain part) becomes larger, as the pressure P applied to the all solid state battery 11 from the restraining member 114 becomes smaller. On the other hand, the amount of the variation of the resistance value R of the certain part of the all solid state battery 11 that varies in response to the variation of the pressure P applied to this certain part becomes smaller, as the pressure P applied to the all solid state battery 11 from the restraining member 114 becomes larger. When the amount of the variation of the resistance value R in response to the variation of the pressure P is small, the above described technical problem such as the deterioration of the all solid state battery 11 is less likely to occur remarkably, compared to the case where the amount of the variation of the resistance value R in response to the variation of the pressure P is large. This is because the difference between the resistance value RC and the resistance value RE that is caused by the unevenness between the pressure PC and the pressure PE is smaller when the amount of the variation of the resistance value R in response to the variation of the pressure P is small, compared to the case where the amount of the variation of the resistance value R in response to the variation of the pressure P is large. Thus, in the present embodiment, the warming instruction determining device 154 determines that the all solid state battery 11 should not be warmed by the heater 14, when the technical problem such as the deterioration of the all solid state battery 11 does not occur remarkably (namely, when the SOC is larger than the threshold value TH2). Namely, in the present embodiment, the all solid state battery 11 is warmed by the heater 14, when the technical problem such as the deterioration of the all solid state battery 11 occurs remarkably (namely, when SOC is smaller than the threshold value TH2).

Considering the above described reason why the all solid state battery 11 is not warmed when the SOC is larger than the threshold value TH2, in some embodiments, the threshold value TH2 is set to an appropriate value that allows the situation where the technical problem such as the deterioration of the all solid state battery 11 occurs remarkably and the situation where the technical problem such as the deterioration of the all solid state battery 11 does not occur remarkably to be distinguished from each other on the basis of the SOC.

Then, the warming instruction determining device 154 sets, to the definite warming amount Q, a value obtained by multiplying the temporary warming amount Qtarget calculated at the step S13 by the warming flag m. Therefore, if the warming flag m is 1, the definite warming amount Q is same as the temporary warming amount Qtarget. On the other hand, if the warming flag m is 0, the definite warming amount Q is 0.

Then, the warming instruction determining device 154 controls the heater 14 so that the heat corresponding to the definite warming amount Q calculated at the step S14 is applied to the edge part 11E (a step S15). As a result, the edge part 11E is warmed (in other words, heated) until the temperature TE of the edge part 11E reaches the target temperature TE_target. Therefore, the resistance value RE decreases due to the warming of the edge part 11E, and thus, the difference between the resistance value RE of the edge part 11E and the resistance value RC of the center part 11C is reduced, and in some embodiments, is reduced to be zero.

(3) TECHNICAL EFFECT

Figure 10:
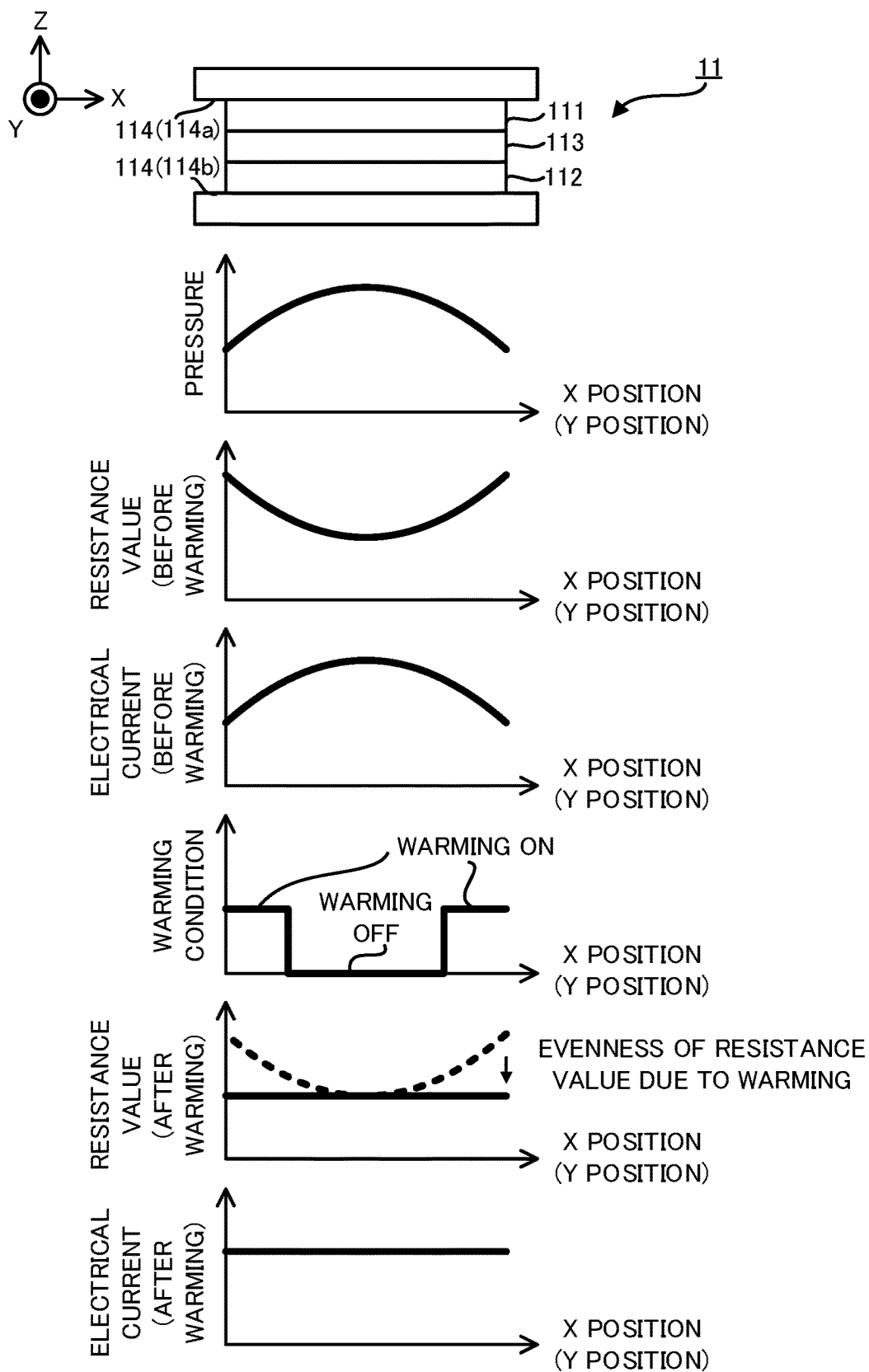
FIG. 10 is a graph that illustrates a distribution in the XY plane of each of the pressure applied to the all solid state battery, the resistance value of the all solid state battery before a warming, the amount of the electric current flowing in the all solid state battery before the warming, a warming condition, the resistance value of the all solid state battery after the warming and the amount of the electric current flowing in the all solid state battery after the warming.
Figure 11:
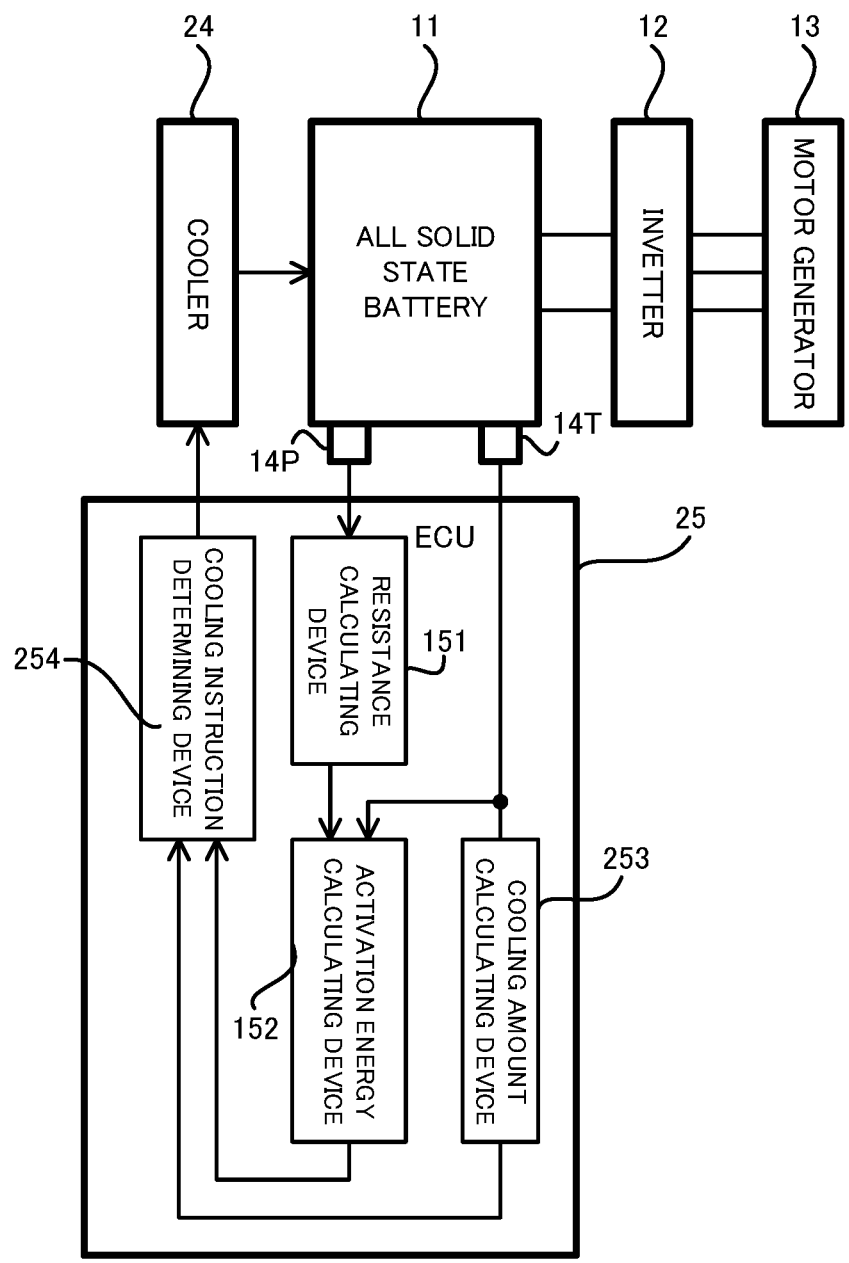
FIG. 11 is a block diagram that illustrates a structure of a vehicle in a first modified example.

As described above, in the present embodiment, the edge part 11E is warmed so that the difference between the resistance value RE of the edge part 11E and the resistance value RC of the center part 11C is reduced. Specifically, when there is a possibility that an excessive large electrical current flows in the center part 11C because of the resistance value RE of the edge part 11E being different from the resistance value RC of the center part 11C relatively greatly as illustrated in second and third graphs in FIG. 10, the edge part 11E is partially warmed as illustrated in a fourth graph in FIG. 10. In this case, typically, the temperature TE of the edge part 11E is higher than the temperature TC of the center part 11C. As a result, as illustrated in a fifth graph in FIG. 10, the difference between the resistance value RE of the edge part 11E and the resistance value RC of the center part 11C is smaller than the difference before the edge part 11E is warmed. Namely, the ECU 15 in the present embodiment is capable of appropriately preventing an unevenness (in other words, a variation or a variability) of the resistance value R of the all solid state battery 11 in the XY plane when there is a possibility that the resistance value R varies in the XY plane due to the unevenness of the pressure P applied to the all solid state battery 11 from the restraining member 114 in the XY plane. Thus, as illustrated in a sixth graph in FIG. 10, there is smaller or less possibility that the excessive large electrical current flows in the center part 11C. Thus, the ECU 15 in the present embodiment is capable of controlling the all solid state battery 11 so as to prevent the deterioration of the all solid state battery 11.

In addition, in the present embodiment, the all solid state battery 11 is not warmed when it is determined on the basis of the activation energy factor k and the SOC of the all solid state battery 11 that the technical problem such as the deterioration of the all solid state battery 11 does not occur remarkably without warming the all solid state battery 11. Thus, it is possible to prevent the excessive increase of the temperature T of the all solid state battery 11, compared to the case where the all solid state battery 11 is warmed regardless of the activation energy factor k and the SOC. As a result, it is possible to prevent the deterioration of the all solid state battery 11 due to the excessive increase of the temperature T of all solid state battery 11. In some embodiments, the all solid state battery 11 is not warmed when the temperature T of the all solid state battery 11 is equal to or larger than an upper limit temperature at which the all solid state battery 11 should not be warmed any more, even if the warming flag m is 1, for the purpose of preventing the deterioration of the all solid state battery 11 due to the excessive increase of the temperature T of all solid state battery 11.

Note that a heatproof temperature of the all solid state battery 11 is higher than that of a liquid type battery in which the electrolyte is liquid, because of the characteristics of the all solid state battery 11. Thus, when the above described temperature control operation for reducing the difference between the resistance value RE and the resistance value RC by warming the edge part 11E is executed to the all solid state battery 11, a range of the temperature over which the all solid state battery 11 is allowed to be warmed is larger, compared to the case where the above described temperature control operation is executed to the liquid type battery. Thus, when the above described temperature control operation is executed to the all solid state battery 11, it is possible to secure more opportunities to warm the all solid state battery 11 for the purpose of reducing the difference between the resistance value RE and the resistance value RC, compared to the case where the above described temperature control operation is executed to the liquid type battery. This is a practically advantageous technical effect.

(4) MODIFIED EXAMPLE (4-1) First Modified Example

In the above described description, the vehicle 1 is provided with the heater 14 that is configured to warm the edge part 11E to which the restraining member 114 applies the pressure that is smaller than the pressure applied to the center part 11C. On the other hand, a vehicle 2 in a first modified example is different from the vehicle 1 in that the vehicle 2 is provided with a cooler 24 instead of (alternatively, in addition to) the heater 14, wherein the cooler 24 is configured to cool the center part 11C to which the restraining member 114 applies the pressure that is larger than the pressure applied to the edge part 11E. Note that the cooler 24 is one example of a "cool apparatus" in the below described additional statement. Moreover, the vehicle 2 is different from the vehicle 1 in that the vehicle 2 is provided with an ECU 25 instead of the ECU 15. The ECU 25 is different from the ECU 15 in that the ECU 25 is provided with a cooling amount calculating device 253 and a cooling instruction determining device 254 instead of the warming amount calculating device 153 and the warming instruction determining device 154. The cooling amount calculating device 253 calculates a temporary cooling amount Qtarget' by using the method that is same as the method used by the warming amount calculating device 153. The temporary cooling amount Qtarget' represents a temporary target value of an amount of heat that should be removed (in other words, transferred) from the all solid state battery 11 (especially, the center part 11C thereof) by the cooling of the cooler 24. Moreover, the cooling instruction determining device 254 sets a cooling flag m' that indicates whether to cool the all solid state battery 11 by the cooler 24 and sets, to a definite cooling amount Q', a value obtained by multiplying the temporary cooling amount Qtarget' by the cooling flag m' by using the method that is same as the method used by the warming instruction determining device 154.

Figure 12:
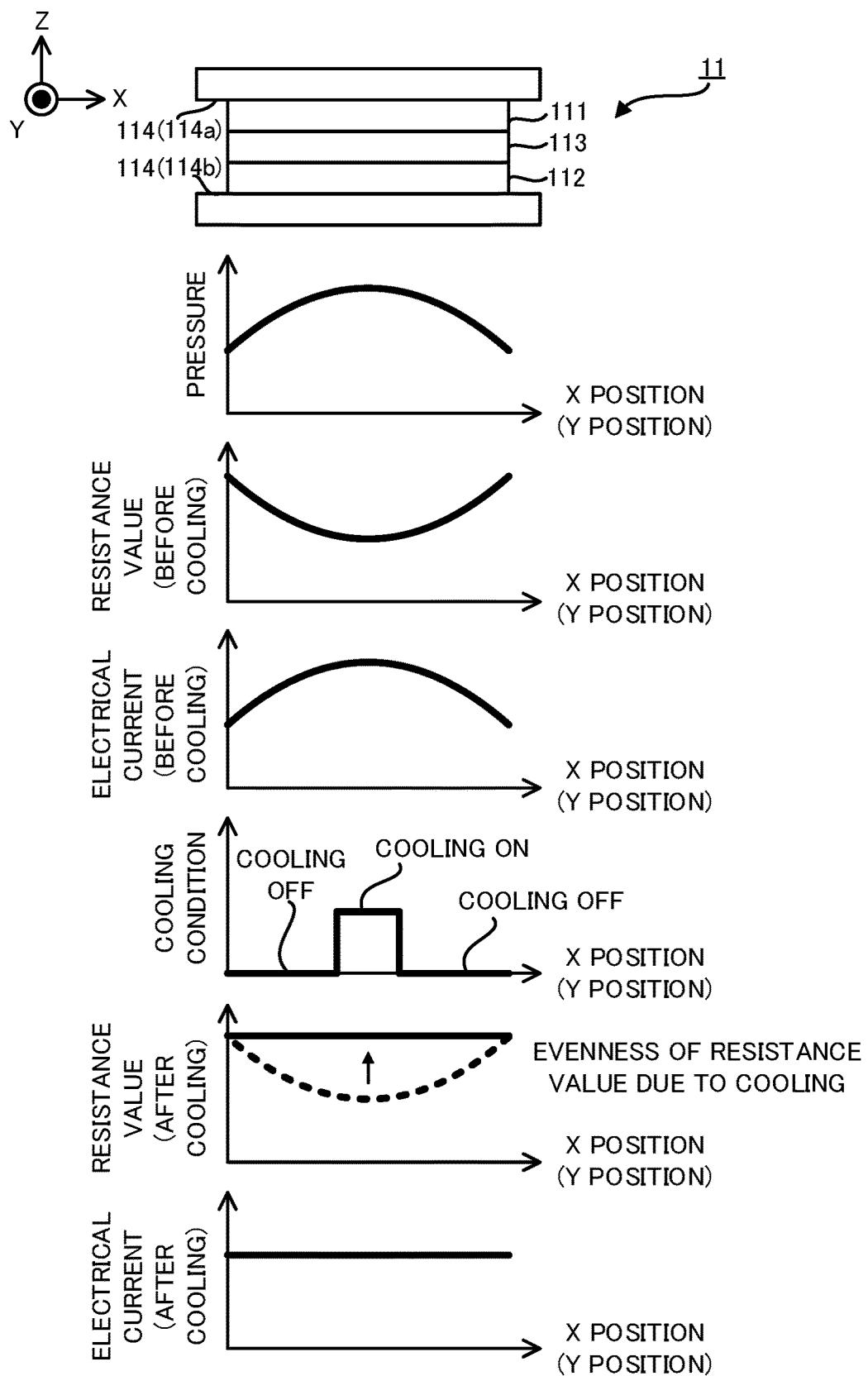
FIG. 12 is a graph that illustrates a distribution in the XY plane of each of the pressure applied to the all solid state battery, the resistance value of the all solid state battery before a cooling, the amount of the electric current flowing in the all solid state battery before the cooling, a cooling condition, the resistance value of the all solid state battery after the cooling and the amount of the electric current flowing in the all solid state battery after the cooling.

As described above, in the first modified example, the center part 11C is cooled so that the difference between the resistance value RE of the edge part 11E and the resistance value RC of the center part 11C is reduced. Specifically, when there is a possibility that the excessive large electrical current flows in the center part 11C because of the resistance value RE of the edge part 11E being different from the resistance value RC of the center part 11C relatively greatly as illustrated in second and third graphs in FIG. 12, the center part 11C is partially cooled as illustrated in a fourth graph in FIG. 12. In this case, typically, the temperature TC of the center part 11C is lower than the temperature TE of the edge part 11E. As a result, as illustrated in a fifth graph in FIG. 12, the difference between the resistance value RE of the edge part 11E and the resistance value RC of the center part 11C is smaller than the difference before the center part 11C is cooled. Thus, as illustrated in a sixth graph in FIG. 12, there is smaller or less possibility that the excessive large electrical current flows in the center part 11C. Thus, a technical effect that is same as the above described technical effect can be also achieved by the first modified example.

(4-2) Second Modified Example

In the above described description, 0 or 1 is set to the warming flag m on the basis of the activation energy factor k and the SOC. However, a value that becomes smaller as the activation energy factor k becomes larger may be set to the warming flag m. A value that becomes smaller as the SOC becomes larger may be set to the warming flag m.

Figure 13A:
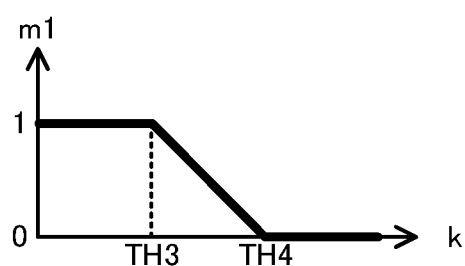
FIG. 13A is a graph that illustrates the warm flag that becomes larger as the activation energy of the all solid state battery becomes larger.
Figure 13B:
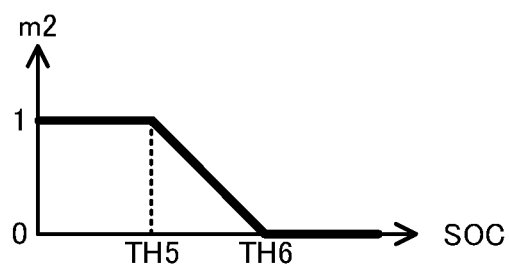
FIG. 13B is a graph that illustrates the warm flag that becomes smaller as the SOC of the all solid state battery becomes larger.

For example, the warming instruction determining device 154 may set a warming flag m1 based on the activation energy factor k and a warming flag m2 based on the SOC separately and set, to the warming flag m, a value obtained by multiplying the warming flag m1 by the warming flag m2. In this case, (i) the warming instruction determining device 154 may set a value of "1" to the warming flag m1, if the activation energy factor k is smaller than a predetermined threshold value TH3, (ii) the warming instruction determining device 154 may set, to the warming flag m1, a value that becomes smaller (namely, decreases) sequentially or stepwisely as the activation energy factor k becomes larger (namely, increases), if the activation energy factor k is larger than the threshold value TH3 and smaller than a predetermined threshold value TH4 (the threshold value TH4 is larger than the threshold value TH3) and (iii) the warming instruction determining device 154 may set a value of "0" to the warming flag m1, if the activation energy factor k is larger than the threshold value TH4, as illustrated in FIG. 13A. Similarly, (i) the warming instruction determining device 154 may set a value of "1" to the warming flag m2, if the SOC is smaller than a predetermined threshold value TH5, (ii) the warming instruction determining device 154 may set, to the warming flag m2, a value that becomes smaller (namely, decreases) sequentially or stepwisely as the SOC becomes larger (namely, increases), if the SOC is larger than the threshold value TH5 and smaller than a predetermined threshold value TH6 (the threshold value TH6 is larger than the threshold value TH5) and (iii) the warming instruction determining device 154 may set a value of "0" to the warming flag m2, if the SOC is larger than the threshold value TH6, as illustrated in FIG. 13B. In some embodiments, the threshold values TH3 and TH4 are set as with the above described threshold value TH1. In some embodiments, the threshold values TH5 and TH6 are set as with the above described threshold value TH2.

According to the second modified example, it is possible to secure more opportunities to warm the all solid state battery 11 for the purpose of reducing the difference between the resistance value RE and the resistance value RC while preventing the excessive increase of the temperature T of the all solid state battery 11 to some degree.

(4-3) Another Modified Example

In the above described description, the ECU 15 calculates the activation energy factor k and controls the heater 14 so that the edge part 11E is warmed if the activation energy factor k is smaller than the threshold value TH1 and the edge part 11E is not warmed if the activation energy factor k is larger than the threshold value TH1. However, considering the fact that the activation energy factor k becomes smaller as the difference between the resistance value RE and the resistance value RC becomes larger (namely, the process of calculating the activation energy factor k is substantially equivalent to the process of determining how large the difference between the resistance value RE and the resistance value RC is) as described above, the ECU 15 may directly calculates the difference between the resistance value RE and the resistance value RC calculated at the step S11 in FIG. 4 and controls the heater 14 so that the edge part 11E is warmed if the calculated difference is larger than a predetermined threshold value TH7 and the edge part 11E is not warmed if the calculated difference is smaller than the threshold value TH7. In some embodiments, the threshold value TH7 is set as with the above described threshold value TH1.

Figure 14:
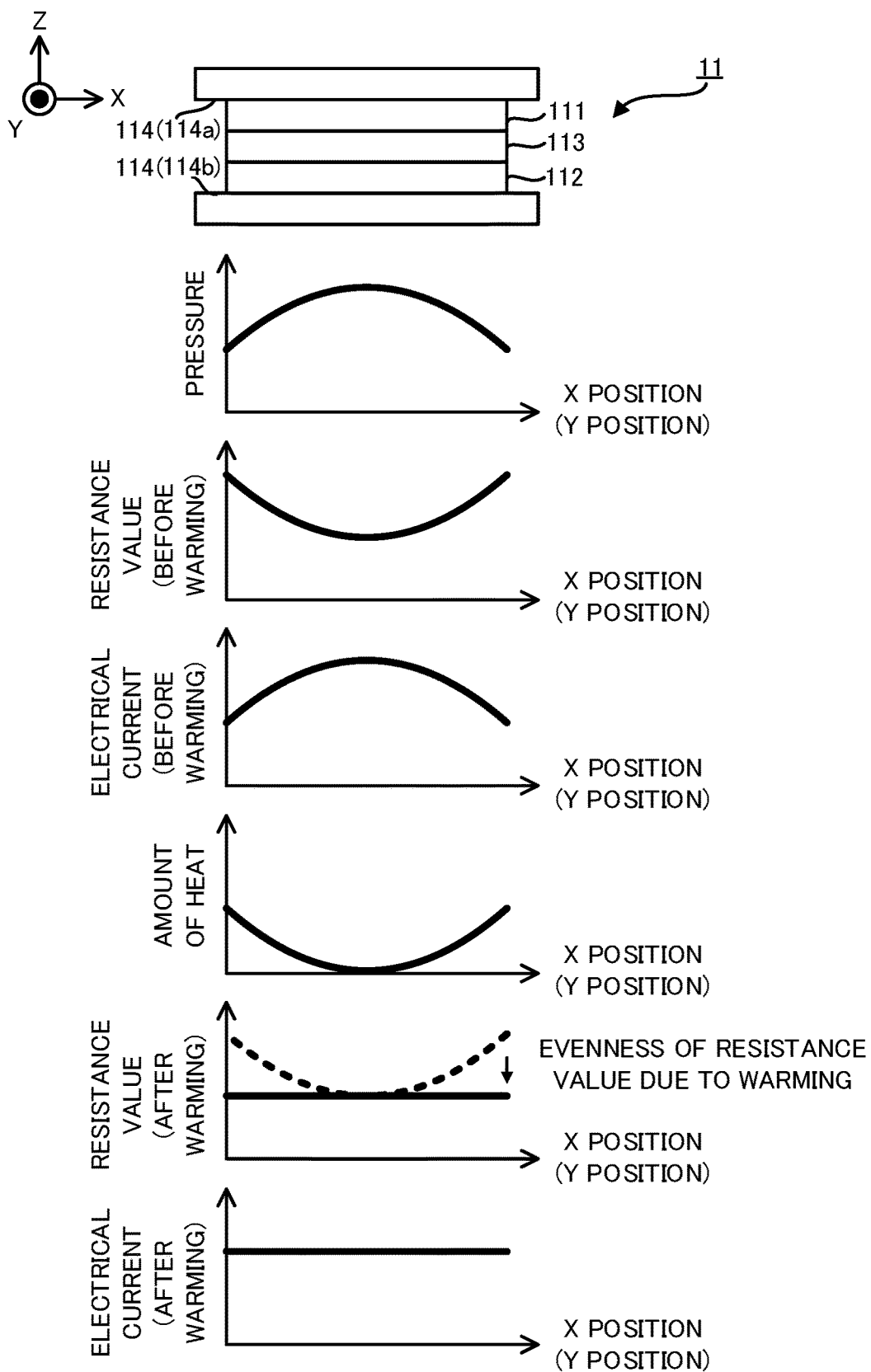
FIG. 14 is a graph that illustrates a distribution in the XY plane of each of the pressure applied to the all solid state battery, the resistance value of the all solid state battery before the warming, the amount of the electric current flowing in the all solid state battery before the warming, a warming condition, the resistance value of the all solid state battery after the warming and the amount of the electric current flowing in the all solid state battery after the warming.

In the above described description, the ECU 35 controls the heater 14 so that the edge part 11E is warmed and the center part 11C is not warmed. However, the ECU 15 may control the heater 14 so that the amount of the heat applied to each part of the all solid state battery 11 from the heater 14 is adjusted accordingly on the basis of the position of each part in the XY plane. For example, as illustrated in FIG. 14 (especially, a fourth graph), the ECU 15 may control the heater 14 so that the amount of the heat applied to each part of the all solid state battery 11 from the heater 14 is adjusted (for example, increases or decreases) on the basis of the resistance value R of each part in the XY plane. In this case, it is possible to prevent the unevenness of the resistance value R of the all solid state battery 11 in the XY plane more appropriately.

Figure 15:
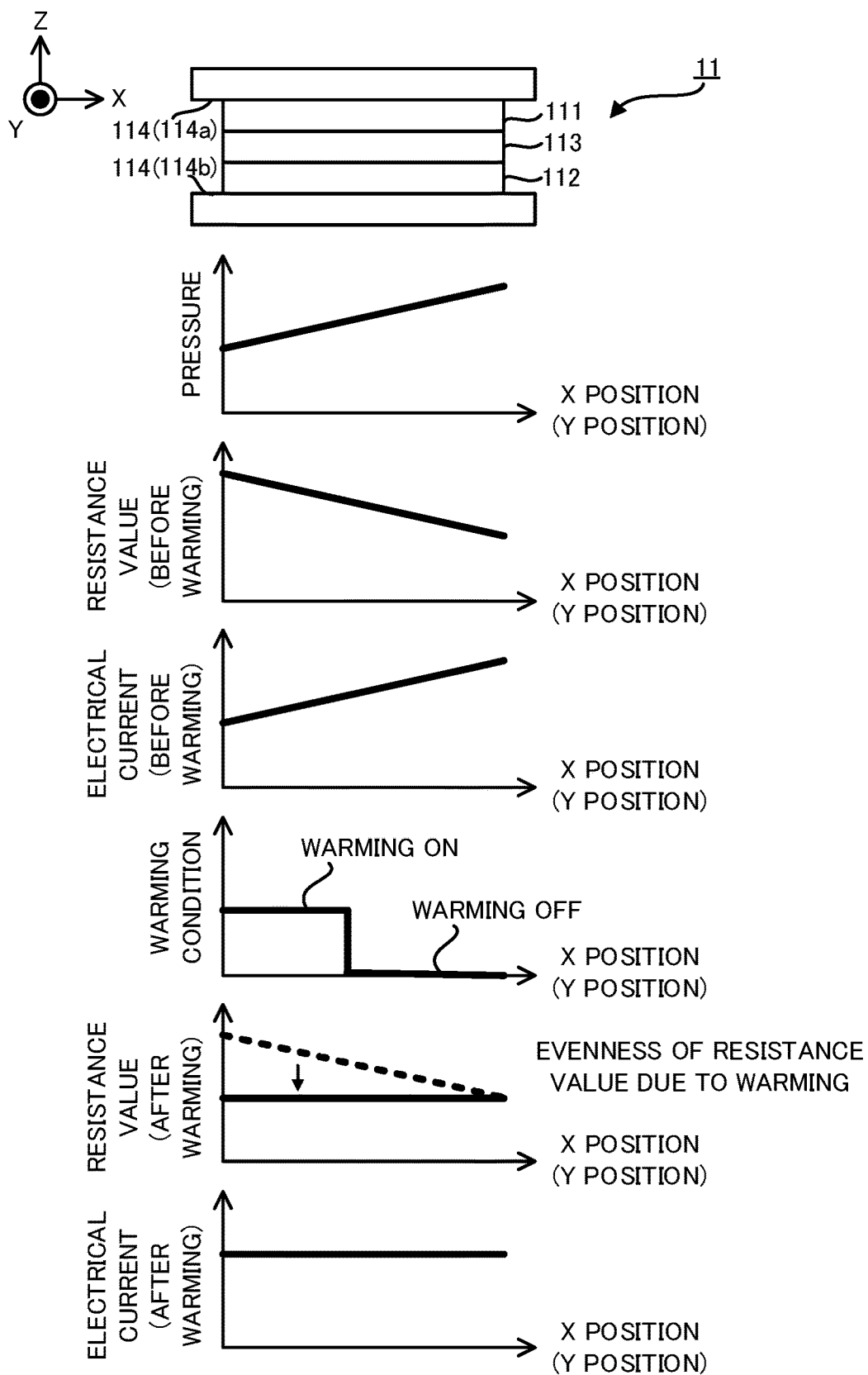
FIG. 15 is a graph that illustrates a distribution in the XY plane of each of the pressure applied to the all solid state battery, the resistance value of the all solid state battery before the warming, the amount of the electric current flowing in the all solid state battery before the warming, a warming condition, the resistance value of the all solid state battery after the warming and the amount of the electric current flowing in the all solid state battery after the warming.

In the above described description, the ECU 15 controls the heater 14 so that the heater 14 warms the edge part 11E to which the relatively small pressure is applied from the restraining member 114 and the heater 14 does not warm the center part 11C to which the relatively large pressure is applied from the restraining member 114. However, the ECU 15 may control the heater 14 so that the heater 14 warms one part (instead of or in addition to the edge part 11E) of the all solid state battery 11 to which the relatively small pressure is applied from the restraining member 114 and the heater 14 does not warm another part (instead of or in addition to the center part 11C) of the all solid state battery 11 to which the relatively large pressure is applied from the restraining member 114. In other words, the ECU 15 may control the temperature distribution of the all solid state battery 11 in the XY plane in any manner without distinguishing between the edge part 11E and the center part 11C. For example, when the pressure P applied to each part of the all solid state battery 11 from the restraining member 114 becomes larger as each part is located toward +X direction more as illustrated in a first graph in FIG. 15, the ECU 15 may control the heater 14 so that the heater 14 warms a part of the all solid state battery 11 that is relatively close to an edge part of the all solid state battery 11 at the −X side (at a left side in FIG. 15) and the heater 14 does not warm a part of the all solid state battery 11 that is relatively close to an edge part of the all solid state battery 11 at the +X side (at a right side in FIG. 15). In this case, the above described technical effect can be achieved even if the pressure P applied from the restraining member 114 varies in any manner in the XY plane. However, in some embodiments, each of the pressure sensor 14P and the temperature sensor 14T are located at an appropriate position based on the unevenness of the pressure P applied from the restraining member 114. For example, one pressure sensor 14P and one temperature sensor 14T are located at a part to which the restraining member 114 applies the relatively large pressure P and another pressure sensor 14P and another temperature sensor 14T are located at a part to which the restraining member 114 applies the relatively small pressure P (5) ADDITIONAL STATEMENT Relating to the above described embodiment, following additional statements will be disclosed.

(5-1) Additional Statement 1

A control apparatus according to the additional statement 1 is configured to control an all solid state battery, the all solid state battery includes a laminated body in which a cathode, an anode and a solid electrolyte layer located between the cathode and the anode are laminated, the control apparatus is configured to execute a control operation for controlling a temperature distribution of the all solid state battery in a plane that intersects with a laminated direction of the laminated body so that a difference between a resistance value of a first part of the all solid state battery and a resistance value of a second part of the all solid state battery that is different from the first part in the plane is smaller than the difference in the case where the control operation is not executed.

If the temperature of a certain part of the all solid state battery increases, the resistance value of this certain part decreases compared to the resistance value before the temperature of the certain part of the all solid state battery increases. On the other hand, if the temperature of the certain part of the all solid state battery decreases, the resistance value of this certain part increases compared to the resistance value before the temperature of the certain part of the all solid state battery decreases. Considering this relationship between the temperature and the resistance value of the certain part of the all solid state battery, the control apparatus according to the additional statement 1 is capable of executing the control operation for controlling the temperature distribution of the all solid state battery so that the difference between the resistance value of the first part of the all solid state battery and the resistance value of the second part of the all solid state battery is reduced. As a result, the control apparatus according to the additional statement 1 is capable of appropriately preventing an unevenness (in other words, a variation or a variability) of the resistance value of the all solid state battery in the plane that intersecting with the laminated direction of the laminated body.

(5-2) Additional Statement 2

A control apparatus according to the additional statement 2 is the control apparatus according to the additional statement 1, wherein a restraining member applies a pressure to the all solid state battery in the laminated direction, the pressure applied to the second part from the restraining member is smaller than the pressure applied to the first part from the restraining member.

If the pressure applied to the second part from the restraining member is smaller than (namely, is different from) the pressure applied to the first part from the restraining member, the resistance value of the second part is different from the resistance value of the first part. Typically, the resistance value of the second part is larger than the resistance value of the first part. Even in this case, the control apparatus according to the additional statement 2 is capable of appropriately preventing the unevenness of the resistance value of the all solid state battery by controlling the temperature distribution of the all solid state battery so that the difference between the resistance value of the first part of the all solid state battery and the resistance value of the second part of the all solid state battery is reduced.

(5-3) Additional Statement 3

A control apparatus according to the additional statement 3 is the control apparatus according to the additional statement 2, wherein the second part is nearer an edge part of the all solid state battery than the first part is, in the plane that intersects with the laminated direction.

If the restraining member applies the pressure to the all solid state battery in the laminated direction, there is a high possibility that the pressure applied from the restraining member to the second part that is relatively close to the edge part of the all solid state battery is different from the pressure applied from the restraining member to the first part that is relatively distant from the edge part of the all solid state battery, because of a relationship between a position at which the restraining member is located and a position at which the all solid state battery is located. Typically, there is a high possibility that the pressure applied from the restraining member to the second part that is relatively close to the edge part of the all solid state battery is smaller than the pressure applied from the restraining member to the first part that is relatively distant from the edge part of the all solid state battery. Thus, the control apparatus according to the additional statement 3 is capable of appropriately preventing the unevenness of the resistance value of the all solid state battery to which the restraining member applies the pressure in the laminated direction.

(5-4) Additional Statement 4

A control apparatus according to the additional statement 4 is the control apparatus according to any one of the additional statements 1 to 4, wherein the resistance value of the second part is larger than the resistance value of the first part, the control operation includes a warm operation for warming the second part so that a temperature of the second part is higher than that in the case where the control operation is not executed.

When the control apparatus according to the additional statement 4 warms (namely, heats) the second part that has the resistance value larger than the resistance value of the first part, the resistance value of the second part decreases compared to the resistance value of the second part before the second part is warmed. As a result, the difference between the resistance value of the first part and the resistance value of the second part is reduced. Thus, the control apparatus according to the additional statement 4 is capable of appropriately preventing the unevenness of the resistance value of the all solid state battery.

(5-5) Additional Statement 5

A control apparatus according to the additional statement 5 is the control apparatus according to any one of the additional statements 1 to 4, wherein the resistance value of the first part is smaller than the resistance value of the second part, the control operation includes a cool operation for cooling the first part so that a temperature of the first part is lower than that in the case where the control operation is not executed.

When the control apparatus according to the additional statement 5 cools the first part that has the resistance value smaller than the resistance value of the second part, the resistance value of the first part increases compared to the resistance value of the first part before the first part is cooled. As a result, the difference between the resistance value of the first part and the resistance value of the second part is reduced. Thus, the control apparatus according to the additional statement 5 is capable of appropriately preventing the unevenness of the resistance value of the all solid state battery.

(5-6) Additional Statement 6

A control apparatus according to the additional statement 6 is the control apparatus according to any one of the additional statements 1 to 5, wherein the control apparatus is configured to execute the control operation when an amount of stored electricity in the all solid state battery is smaller than a predetermined first threshold value, the control apparatus is configured not to execute the control operation when the amount of the stored electricity in the all solid state battery is larger than the first threshold value.

When the amount of the stored electricity in the all solid state battery is smaller than the first threshold value (in other words, is relatively small), the resistance value of the certain part of the all solid state varies more greatly in response to the variation of the pressure applied to this certain part, compared to the case where the amount of the stored electricity in the all solid state battery is larger than the first threshold value (in other words, is relatively large). Thus, when the amount of the stored electricity in the all solid state battery is smaller than the first threshold value, there is a higher possibility that the resistance value of the all solid state battery varies, compared to the case where the amount of the stored electricity in the all solid state battery is larger than the first threshold value. The control apparatus according to the additional statement 6 is capable of selectively controlling the temperature distribution of the all solid state battery when there is a higher possibility that the resistance value of the all solid state battery varies. On the other hand, the control apparatus according to the additional statement 6 may not control the temperature distribution of the all solid state battery when there is a lower possibility that the resistance value of the all solid state battery varies. Thus, the control apparatus according to the additional statement 6 is capable of appropriately preventing the unevenness of the resistance value of the all solid state battery without excessively increasing or decreasing the temperature of the all solid state battery due to the control operation.

(5-7) Additional Statement 7

A control apparatus according to the additional statement 7 is the control apparatus according to any one of the additional statements 1 to 6, wherein the control apparatus is configured to execute the control operation when the difference between the resistance value of the first part and the resistance value of the second part is larger than a predetermined second threshold value, the control apparatus is configured not to execute the control operation when the difference between the resistance value of the first part and the resistance value of the second part is smaller than the second threshold value.

When the difference between the resistance value of the first part and the resistance value of the second part is larger than the second threshold value, it is presumed that the resistance value of the all solid state battery varies relatively largely (namely, a degree of the unevenness of the resistance value of the all solid state battery is relatively large), compared to the case where the difference between the resistance value of the first part and the resistance value of the second part is smaller than the second threshold value. Thus, the control apparatus according to the additional statement 7 is capable of selectively controlling the temperature distribution of the all solid state battery when the degree of the unevenness of the resistance value of the all solid state battery is relatively large. On the other hand, the control apparatus according to the additional statement 7 may not control the temperature distribution of the all solid state battery when the resistance value of the all solid state battery does not vary (alternatively, the degree of the unevenness of the resistance value of the all solid state battery is relatively small). Thus, the control apparatus according to the additional statement 7 is capable of appropriately preventing the unevenness of the resistance value of the all solid state battery without excessively increasing or decreasing the temperature of the all solid state battery due to the control operation.

(5-8) Additional Statement 8

A battery system according to the additional statement 8 is provided with: an all solid state battery including a laminated body in which a cathode, an anode and a solid electrolyte layer located between the cathode and the anode are laminated; and the control apparatus, according to any one of the additional statements 1 to 7.

The battery system according to the additional statement 8 is capable of achieving a technical effect that is same as the technical effect achieved by the above described control apparatus according to any one of the additional statements 1 to 7.

(5-9) Additional Statement 9

A battery system according to the additional statement 9 is the battery system according to the additional statement 8, wherein the battery system further comprises at least one of a cool apparatus that is configured to cool the all solid state battery and a warm apparatus that is configured to warm the all solid state battery, the control apparatus is configured to execute the control operation by using at least one of the cool apparatus and the warm apparatus.

The battery system according to the additional statement 9 is capable of achieving the technical effect that is same as the technical effect achieved by the above described control apparatus according to any one of the additional statements 1 to 7 by controlling the temperature distribution of the all solid state battery by using at least one of the warm apparatus and the cool apparatus.

At least one portion of the feature in the above described embodiment and the modified examples may be eliminated or modified accordingly. At least one portion of the feature in the above described embodiment and the modified examples may be combined with another one of the above described embodiments and the modified examples.

In addition, the entire contents of the above described Patent Literature 1 is incorporated herein by reference.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiments of the present disclosure have been described in detail, it should be understood that the various changes, substitutions, and alterations could be made hereto without departing from the spirit and scope of the disclosure. A control apparatus and a battery system, each of which involves such changes, is also intended to be within the technical scope of the present disclosure.

The invention claimed is:

1. A control apparatus that is configured to control an all solid state battery, the all solid state battery including a laminated body in which a cathode, an anode and a solid electrolyte layer located between the cathode and the anode are laminated, the control apparatus comprising:
   a temperature sensor configured to detect a temperature of the all solid state battery;
   a pressure sensor configured to detect a pressure of the all solid state battery, the pressure sensor is positioned between a restraining plate and the cathode or between the restraining plate and the anode of the all solid state battery, the restraining plate applies the pressure to the all solid state battery in a laminated direction of the laminated body that is measured by the pressure sensor; and
   an electronic control unit configured to execute a control operation for controlling a temperature distribution of the all solid state battery in a plane that intersects with the laminated direction of the laminated body based on the temperature detected by the temperature sensor and the pressure detected by the pressure sensor so that a difference between a resistance value of a first part of the all solid state battery and a resistance value of a second part of the all solid state battery that is different from the first part in the plane is smaller than the difference in the case where the control operation is not executed.

2. The control apparatus according to claim 1, wherein a restraining member applies a pressure to the all solid state battery in the laminated direction,
   the pressure applied to the second part from the restraining member is smaller than the pressure applied to the first part from the restraining member.

3. The control apparatus according to claim 2, wherein the second part is nearer an edge part of the all solid state battery than the first part is, in the plane that intersects with the laminated direction.

4. The control apparatus according to claim 1, wherein the resistance value of the second part is larger than the resistance value of the first part, the control operation includes a warm operation for warming the second part so that a temperature of the second part is higher than that in the case where the control operation is not executed.

5. The control apparatus according to claim 1, wherein
the resistance value of the first part is smaller than the resistance value of the second part,
the control operation includes a cool operation for cooling the first part so that a temperature of the first part is lower than that in the case where the control operation is not executed.

6. The control apparatus according to claim 1, wherein
the electronic control unit is configured to execute the control operation when an amount of stored electricity in the all solid state battery is smaller than a predetermined first threshold value,
the electronic control unit is configured not to execute the control operation when the amount of the stored electricity in the all solid state battery is larger than the first threshold value.

7. The control apparatus according to claim 1, wherein
the electronic control unit is configured to execute the control operation when the difference between the resistance value of the first part and the resistance value of the second part is larger than a predetermined second threshold value,
the electronic control unit is configured not to execute the control operation when the difference between the resistance value of the first part and the resistance value of the second part is smaller than the second threshold value.

8. The control apparatus according to claim 1, wherein the temperature sensor is positioned in the plane that intersects with the laminated direction of the laminated body of the all solid state battery.

9. The control apparatus according to claim 1, wherein the temperature sensor is positioned between the restraining plate and the cathode of the all solid state battery.

10. The control apparatus according to claim 1, wherein the pressure sensor is positioned between the restraining plate and the cathode of the all solid state battery.

11. The control apparatus according to claim 1, wherein the pressure sensor is positioned between the restraining plate and the anode of the all solid state battery.

12. The control apparatus according to claim 1, wherein the temperature sensor is positioned between the restraining plate and the anode of the all solid state battery.

13. A battery system comprising:
an all solid state battery including a laminated body in which a cathode, an anode and a solid electrolyte layer located between the cathode and the anode are laminated; and
a temperature sensor configured to detect a temperature of the all solid state battery;
a pressure sensor configured to detect a pressure of the all solid state battery, the pressure sensor is positioned between a restraining plate and the cathode or between the restraining plate and the anode of the all solid state battery, the restraining plate applies the pressure to the all solid state battery in a laminated direction of the laminated body that is measured by the pressure sensor; and
an electronic control unit configured to execute a control operation for controlling a temperature distribution of the all solid state battery in a plane that intersects with the laminated direction of the laminated body based on the temperature detected by the temperature sensor and the pressure detected by the pressure sensor so that a difference between a resistance value of a first part of the all solid state battery and a resistance value of a second part of the all solid state battery that is different from the first part in the plane is smaller than the difference in the case where the control operation is not executed.

14. The battery system according to claim 13, wherein
the battery system further comprises at least one of a cool apparatus that is configured to cool the all solid state battery and a warm apparatus that is configured to warm the all solid state battery,
the electronic control unit is configured to execute the control operation by using at least one of the cool apparatus and the warm apparatus.

15. The battery system according to claim 13, wherein the temperature sensor is positioned in the plane that intersects with the laminated direction of the laminated body of the all solid state battery.

16. The battery system according to claim 13, wherein the temperature sensor is positioned between the restraining plate and the cathode of the all solid state battery.

17. The battery system according to claim 13, wherein the pressure sensor is positioned between the restraining plate and the cathode of the all solid state battery.

18. The battery system according to claim 13, wherein the pressure sensor is positioned between the restraining plate and the anode of the all solid state battery.

19. The battery system according to claim 13, wherein the temperature sensor is positioned between the restraining plate and the anode of the all solid state battery.

* * * * *